United States Patent [19]

Cochran et al.

[11] Patent Number: 4,525,810
[45] Date of Patent: Jun. 25, 1985

[54] SEMICONDUCTOR MEMORY CAPABLE OF BOTH READ/WRITE AND READ-ONLY OPERATION

[75] Inventors: William H. Cochran; Philip T. Wu, both of Rochester, Minn.

[73] Assignee: International Business Machines Corporation, Armonk, N.Y.

[21] Appl. No.: 492,976

[22] Filed: May 9, 1983

Related U.S. Application Data

[63] Continuation of Ser. No. 173,240, Jul. 28, 1980, abandoned.

[51] Int. Cl.³ .............................................. G11C 11/24
[52] U.S. Cl. .................................. 365/102; 365/178; 365/184
[58] Field of Search ................ 365/102, 104, 178, 184

[56] References Cited

U.S. PATENT DOCUMENTS

| | | | |
|---|---|---|---|
| 4,031,524 | 6/1977 | Heeren | 365/104 |
| 4,090,257 | 5/1978 | Williams | 365/184 |
| 4,095,281 | 6/1978 | Denes | 365/184 |
| 4,188,671 | 2/1980 | Lynes | 365/149 |
| 4,195,357 | 3/1980 | Kuo et al. | 365/149 |
| 4,202,044 | 5/1980 | Beilstein et al. | 365/184 |
| 4,274,147 | 6/1981 | Padgett et al. | 365/104 |
| 4,300,210 | 11/1981 | Chakravarti et al. | 365/149 |
| 4,488,265 | 12/1984 | Kotecha | 365/189 |

Primary Examiner—James W. Moffitt
Attorney, Agent, or Firm—J. Michael Anglin

[57] ABSTRACT

A single-FET-per cell read/write memory having capacitor storage elements also contains a pattern of fixed, latent data represented by ion implants in some of the FETs. This pattern is loaded into the capacitors by addressing the cells with a voltage between the thresholds of the normal and the implant-modified FETs, so that some of the capacitors are discharged and others are not. Thereafter, the data may be read out, or overwritten with variable data, by addressing the cells with a voltage higher than both thresholds.

13 Claims, 4 Drawing Figures

SEMICONDUCTOR MEMORY CAPABLE OF BOTH READ/WRITE AND READ-ONLY OPERATION

This is a continuation of application Ser. No. 173,240 filed 7/28/80 and now abandoned.

BACKGROUND

The present invention relates to static information storage, and more particularly concerns an integrated-circuit semiconductor read/write memory whose storage cells additionally contain a personalizable, selectively readable pattern of read-only data.

Semiconductor memories are divided into two major categories. Read/write memories (sometimes mislabelled RAM) have storage cells whose contents are freely alterable, while read-only memories (termed ROM or ROS) contain fixed data which is not changeable except by a lengthy programming or personalization process.

Frequently, however, a need arises for a memory which is basically read/write, yet which can also evoke a fixed, non-volatile, latent-image data pattern. Microprocessor-based controllers and small data-processing systems, for example, commonly require initialization programs upon power-up, but these programs are thereafter dispensable and can be overwritten with operating programs or data. Several approaches have been taken to provide such a function. Physically separate read/write and read-only memory integrated-circuit chips may be selectively enabled in the same address space, for instance. Separate read/write and read-only storage cells may be placed on the same chip, as in U.S. Pat. No. 4,193,128 to Brewer. Separate transistors may even be placed in the same cell to provide these two modes, as in U.S. Pat. No. 4,095,281 to Denes. Geometric asymmetry of a read/write cell for storing read-only data has been proposed in U.S. Pat. Nos. 3,662,351 and 3,820,086 to Ho et al, in U.S. Pat. No. 3,801,967 to Berger et al and in the IBM Technical Disclosure Bulletin, May 1975, pages 3634–35 by Balasubramanian et al. The use of asymmetry, however, requires a balanced multi-transistor storage cell of large size, as does the Denes system. Dennison et al have suggested, IBM Technical Disclosure Bulletin, June 1978, pages 190–93 and id., October 1978, pages 1902–03, the replacement of these large static cells with single-transistor dynamic storage cells having capacitive storage elements whose leakage can be varied to attain a read-only mode of operation. Such a memory chip requires bulky peripheral sources of light or other energy for operation, and its fabrication would be difficult and expensive.

SUMMARY OF THE INVENTION

The present invention achieves a read/write memory having apparatus additionally capable of storing a pattern of fixed, read-only data, and propounds a method of accessing such read-only data. Broadly, such a memory contains an array of storage cells having field-effect transistors (FETs) with two different threshold voltages for establishing the read-only data. Control means accesses this data by first loading into storage elements of the cells different voltages, depending upon the thresholds of the associated FETs, and by thereafter selecting or addressing any of the cells in a normal read/write manner so as to transfer the stored voltage of that cell to an output. This allows the present dual-purpose memory to achieve a storage density substantially equal to that of a strictly read/write, single-transistor-per-cell memory, without either the large cell sizes or the expensive peripheral energy sources required by the prior art. The minimal increase in complexity of the present invention does not adversely affect either the array density or the data access time. Although additional time is necessary to load the read-only data before it can be used, this operation can be performed when a data processor would not be using the memory; when the read-only data is later accessed, no speed penalty whatsoever is paid for the additional read-only capability. Other features and advantages of the invention will appear to those skilled in the art from the following description of a preferred embodiment.

DETAILED DESCRIPTION

Figure 1:
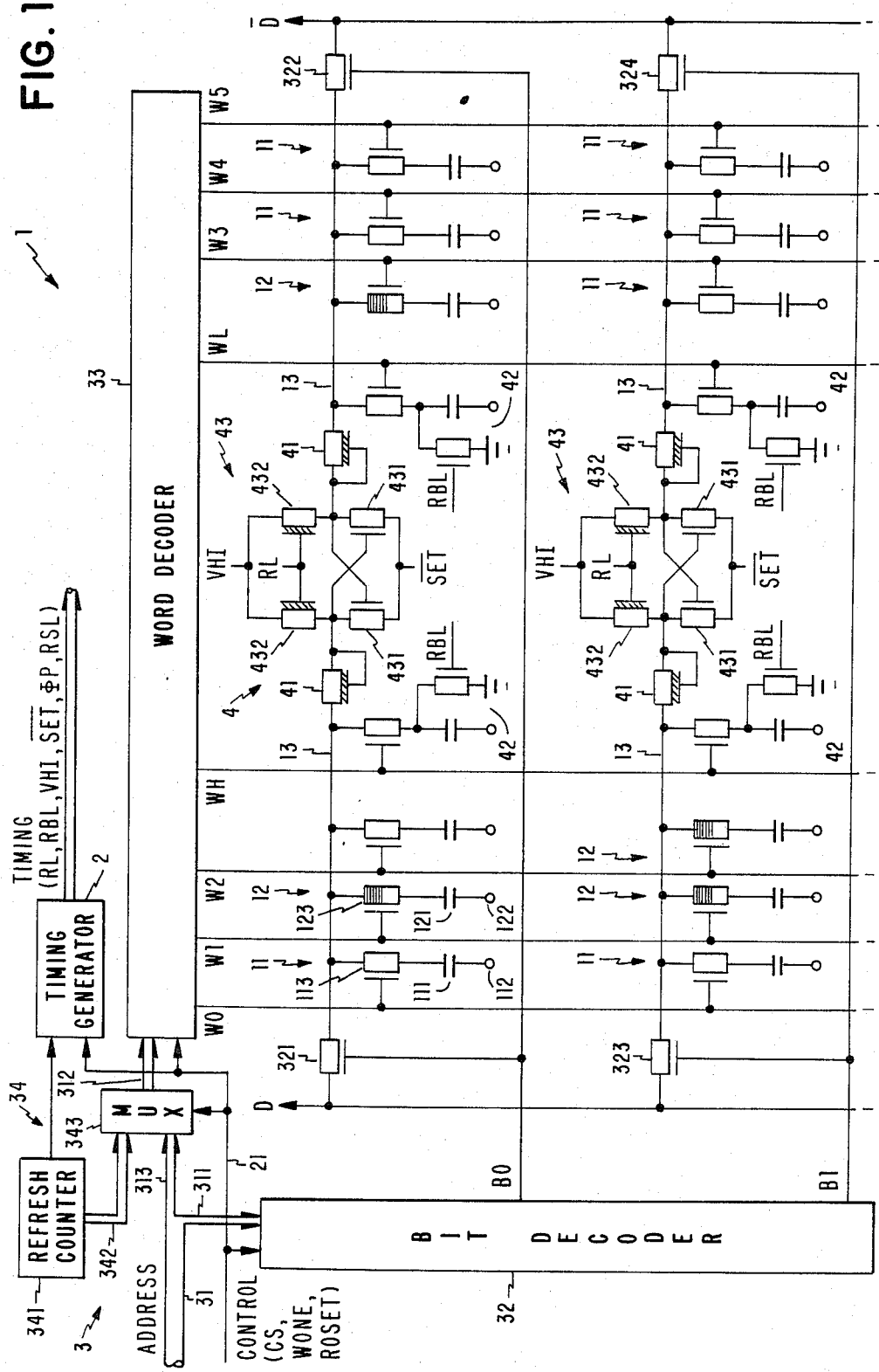
FIG. 1 is a diagram of a memory system according to the invention.

FIG. 1 shows a complete memory system according to the invention. An array 1 contains storage cells in a conventional matrix layout, such as the well-known "half-contact per cell" configuration. Cells 11 of a first type include a capacitor storage element 111 coupled to a fixed supply potential VDD at 112 and to the source of a field-effect transistor (FET) 113. FET 113 has a conventional enhancement-mode structure. Cells 12 of a second type have corresponding capacitor storage elements 121 and VDD connections 122. Their FETs 123, however, have a different structure, indicated by the horizontal bars at the drain contacts. Cells of these two types are located to form a desired pattern of read-only data, cells 11 representing a binary Zero, cells 12 representing a One. Cells of both types are interconnected by bit lines 13 coupled to the drains of FETs 113 and 123.

Figure 2:
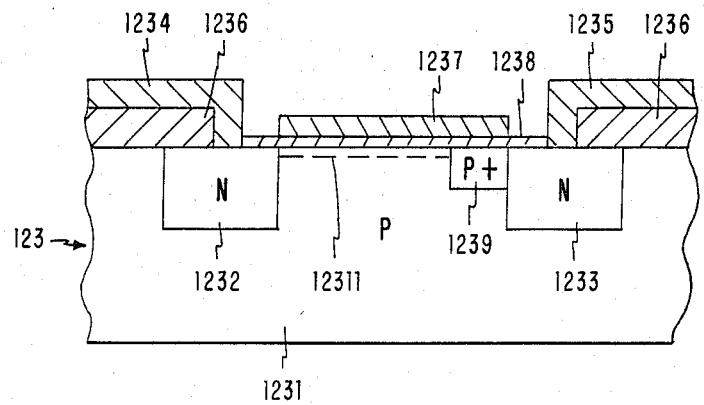
FIG. 2 shows the structure of one type of storage-cell FET used in FIG. 1.

FIG. 2 details the structure of an FET 123. A P-doped substrate 1231 has N-doped source and drain diffusions 1232, 1233 with ohmic contacts to conductors 1234, 1235 deposited on top of insulating layer 1236. Conductive gate contact 1237 overlies thin insulating layer 1238. A localized highly P-doped region 1239 is located adjacent drain 1233; that is, region 1239 is located in a relatively small volume, rather than being distributed throughout channel region 12311 as would be done in conventional practice. Localized region 1239 raises the threshold voltage of FET 123 to a value VT2 higher than the threshold VT1 of an FET 113 which is otherwise similar but does not include an implant 1239, whenever contact 1235 is near ground potential. However, when contact 1235 is raised to a higher positive potential, region 1239 becomes depleted of holes; electron conduction through the entire channel 12311 then occurs when gate 1237 exceeds a threshold voltage which is about equal to VT1 of FET 113. For example, when drain 1235 is near ground potential, a positive voltage of about VT1=1.0 volt on gate 1237 is sufficient to invert the lightly-doped P material under gate 1237 to form N channel 12311, while about VT2=3.0 is required to establish conduction through implant 1239. The inclusion of regions 1239 in particular cells of array 1 may be done with a conventional masking step and ion implantation of boron or other suitable impurity material during fabrication of the memory.

Returning to FIG. 1, the remaining circuitry may be considered as control means for transferring data to and from particular cells 11 and 12 of storage array 1. A timing generator 2 of conventional design responds to external control signals on lines 21 to produce various signals for sequencing the operations required for individual memory cycles, as discussed more fully in connection with FIG. 4.

Address circuits 3 receive external address signals on lines 31. Bit decoder 32 may be a conventional decoder for converting binary coded signals on low-order address lines 311 into 1-of-N coded bit-select signals on lines B0, B1, etc. Each B line gates data signals from the FETs 113 or 123 in one row of array 1 via a bit line 13 thru an FET 321 to complementary data lines D, $\overline{D}$, and also in the reverse direction. That is, D, $\overline{D}$ serve as data input/output (I/O) lines for reading data from array 1 and for writing data into array 1 from an external source. Word decoder 33 converts coded binary signals on address lines 312 into 1-of-N word-select signals on lines W0, W1, etc. Each word-select line W connects to the gate contact of the FETs 113 or 123 in one column of array 1. Relevant details of word decoder 33 will be described in conjunction with FIG. 3. The capacitor storage elements 111, 121 require periodic refreshing to retain their data signals. Conventional refresh circuits 34 may include a counter 341 for producing refresh addresses 342 and a multiplexer 343 for switching between addresses 342 and the high-order external address lines 313. Refresh circuits 34 may be physically located either on the same integrated-circuit chip with the remaining components of FIG. 1, or external to that chip.

Figure 3:
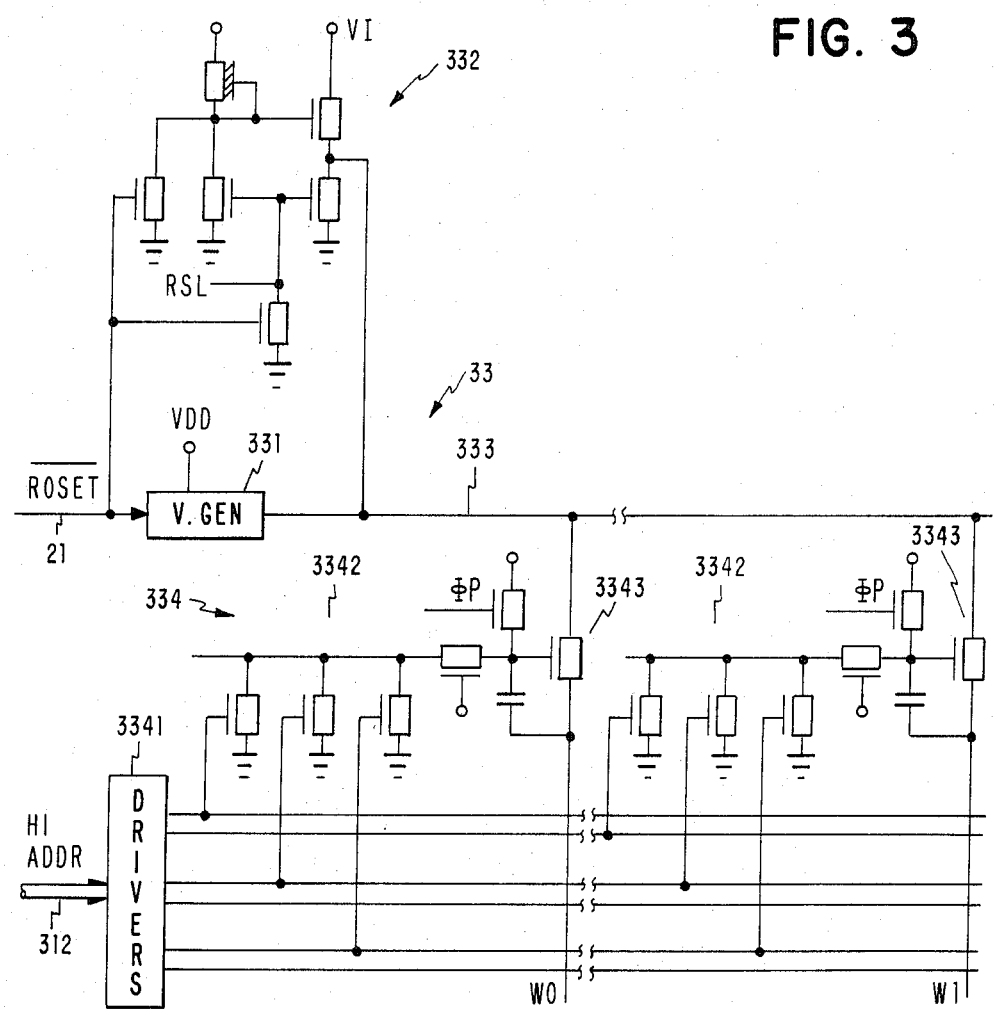
FIG. 3 details a word decoder used in FIG. 1.

FIG. 3 shows relevant details of word decoder 33, FIG. 1. A conventional voltage generator 331 supplied by VDD provides a bootstrapped first line voltage VDD+VT for allowing capacitors 111, 112 to be charged to the full VDD potential (i.e., a full binary One) when bit lines 13 are at VDD. VT may be about equal to VT1; it need not be as high as VT2. Generator 331 is disabled whenever $\overline{ROSET}$ control signal 21 is low. Voltage generator 332 controls an intermediate voltage level VI. VI is a second line voltage, having a value less than the threshold voltage VT2 of the implanted array FETs 123, but higher than the threshold voltage VT1 of the normal array FETs 113. That is, if their drains are at ground potential, a gate voltage of VI volts is sufficient to turn on FETs 113, but FETs 123 will not conduct. VI may be produced by an on-chip supply from VDD, or it may be supplied externally. Both generators 331 and 332 are conventionally pulsed by a timing signal RSL related to RL. As shown by the diagram, generator 332 is enabled when $\overline{ROSET}$ is low. Therefore, line 333 is pulsed to a normal voltage VDD+VT when $\overline{ROSET}$ is high, but is pulsed only to an intermediate voltage VI when $\overline{ROSET}$ is low.

Conventional decoder circuits 334 distribute the line voltage 333 to the appropriate word-select lines W0, W1, etc. Drivers 3341 convert the coded high-order addresses 312 into complementary pairs, different combinations of which are detected by individual gating circuits 3342. Thus, only one at a time of the word lines W0, W1, etc., is coupled to line 333 by word switches 3343. These switches are gated by a conventional precharge signal $\Phi P$ from timing generator 2, FIG. 1, and include bootstrap capacitors to eliminate threshold drops across their FETs.

Returning again to FIG. 1, sense circuits 4 have a generally conventional design, but may be provided with additional functions in aid of the present invention, as will be pointed out. Bit lines 13 couple storage cells 11, 12 through transfer devices 41, which comprise depletion-mode FETs. Dummy storage cells 42 are conventionally controlled by word-select lines WH and WL and timing signal RBL to provide a reference voltage level for sense amplifiers 43. Each sense amplifier 43 includes cross-coupled FETs 431 and depletion-mode load FETs 432 forming a latch circuit. The sense-amplifier terminals marked $\overline{SET}$, RL and VHI are coupled to the indicated signals from timing generator 2 for presetting and loading storage array 1, and also for read/write memory functions, in a manner to be described in conjunction with FIG. 4.

Figure 4:
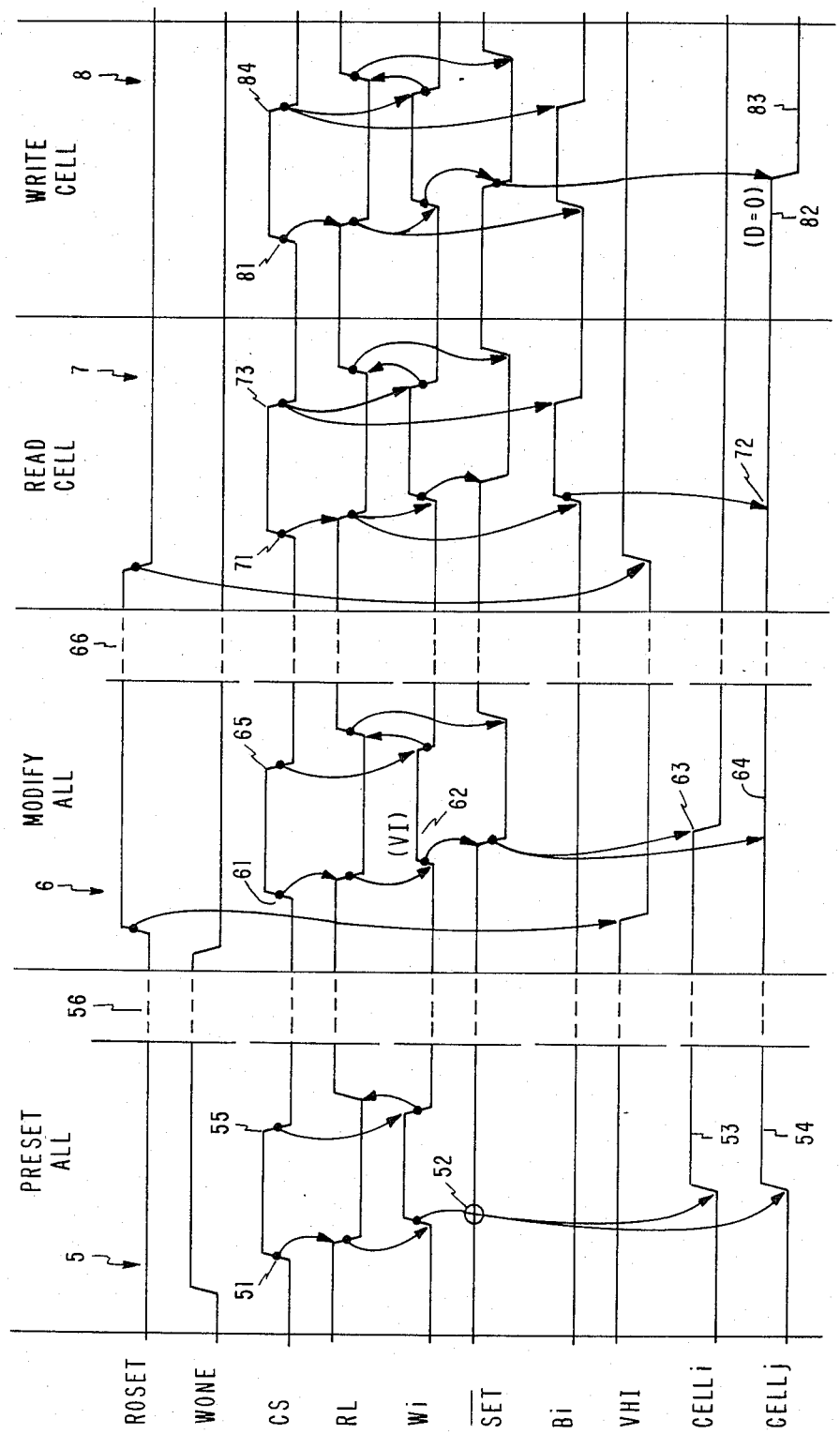
FIG. 4 is a timing diagram illustrating the operation of the memory shown in FIG. 1.

FIG. 4 shows how the described system is used as both a read/write and a read-only memory. Broadly, the pattern of fixed or read-only data established by the two types of cells 11, 12 (FIG. 1) is loaded into the storage elements 111, 121 of the cells, after which the memory functions in a normal read-write mode, wherein the read-only data may be both read out and overwritten with arbitrary external data. More specifically, loading the read-only data involves a number of Preset cycles for storing a logic One voltage into all cells of the array, followed by a number of Modify cycles in which the storage capacitors of type-11 cells are discharged to a Zero voltage, while the type-12 cell capacitors are unaffected.

In FIG. 4, ROSET and WONE are control signals which may be received on lines 21, FIG. 1. (ROSET is the logic complement of $\overline{ROSET}$, FIG. 3.) CS is a conventional chip-select control signal which initiates every memory cycle, and which is commonly used to synchronize timing generator 2. RL, $\overline{SET}$ and VHI are produced by generator 2 in a conventional manner. Wi and Bi are two of the word-select and bit-select signals produced by decoders 33 and 32 respectively. CELLi and CELLj represent the voltages on the storage capacitors 111 and 121 of a type-11 cell and a type-12 cell respectively; both CELLi and CELLj are coupled to word-select line Wi.

The sequence of Preset cycles 5 begins at any cell address, which may be supplied either from address lines 31 or from refresh circuits 341. Preset cycles 5 occur when WONE goes high (WONE=1) with a low level on ROSET (ROSET=0). When CS=1 at 51, RL=0 initiates select voltage Wi=1 for that particular address. Bi, however, is constrained by WONE=1 to remain low, so that all of the bit lines 13 are decoupled from the data I/O lines D, $\overline{D}$. Also, WONE=1 causes $\overline{SET}$ to remain high at 52. Since this condition prevents either of the FETs in latch 431 (FIG. 1) from conducting, the VHI=1 potential via FETs 432 appears on all bit lines 13. This high voltage allows a full binary One to be written into both the type-11 and the type-12 cells, as indicated by CELLi=1 and CELLj=1 at points 53, 54, FIG. 4. A falling edge of CS at 55 causes the Preset cycle to complete itself. Broken lines at 56 represent additional Preset cycles at different word addresses. Since all cells in the column addressed by Wi are preset to a binary One in a single cycle, the Preset sequence need only have a number of cycles equal to the number of columns in the storage array 1, just as in a conventional refresh operation; it is this fact which allows refresh counter 341 to act as an address source for Preset cycles 5.

The sequence of Modify cycles 6 is signalled by ROSET=1 after WONE=0. Again, CS=1 at 61 causes RL=0 to enable word-select line Wi at the beginning address of the sequence. This time, however, Wi only goes up to the intermediate voltage VI at point 62, instead of to VDD+VT as explained in connection with FIG. 3. At this time VHI=0, so that all bit lines 13 are coupled to ground potential through FETs 432 of all sense amplifiers 43. ROSET=1 also disables bit decoder 32, so that all Bi remain low, and all FETs 321 remain off. Then, since VI exceeds the threshold voltage of FETs 113 in all type-11 cells, those cells discharge toward Zero, as at 63. But, since VI is less than the higher threshold voltage of FETs 123 in all type-12 cells, those FETs do not conduct and the voltage on their storage capacitors 121 remains at VDD, as illustrated at point 64, FIG. 4. The trailing edge of CS closes this Modify cycle, leaving CELLi=0 and CELLj=1. Additional Modify cycles, indicated at 66, load the read-only data pattern of the remaining columns of array 1 into the appropriate capacitor storage elements. Here again, refresh counter 341 is a convenient source of address signals for sequencing the Modify cycles 6.

After cycles 5, 6 have loaded the pattern or image of fixed data into storage array 1, data from any selected cell may be read out to an external circuit (not shown) by a Read cycle 7, for which ROSET=0 and WONE=0. The leading edge CS=1 at time 71 followed by RL=0 raises the word-select and bit-select lines Wi, Bi for selecting the particular cell (either 11 or 12) specified by an externally supplied address in lines 31. Since RL=0 and $\overline{SET}$=0 and VHI=1, sense circuits 4, FIG. 1 function normally to sense and latch the contents of the addressed cell, say CELLj, at point 72, on bit lines 13; then the particular FET 321 selected by Bi transfers the (complementary) voltages on one pair of bit lines 13 to the data I/O lines D, $\overline{D}$ and thence to conventional interface circuits, not shown. Read cycle 7 closes when CS falls at 73.

A Write cycle 8 can write arbitrary variable external data in any storage cell 11 or 12 in a similar manner. CS=1 at 81 initiates the same sequence of events as at 71-72 in a read cycle. However, an externally supplied data input, shown as D=0 (and hence $\overline{D}$=1) the appropriate bit line 13 and sense amplifier 43 to the voltage of the input data at 83. Write cycle 8 closes with CS=0 at time 84, following the same sequence as for a Read cycle.

Thereafter, Read and Write cycles can occur in any order. Since Wi=VDD+VT for these cycles is sufficient to turn on both the type-11 and the type-12 storage cells, their structural differences, and hence the fixed, latent data pattern, make no difference. This data pattern can be reloaded into storage array 1 at any time, however, merely by re-executing the Preset and Modify cycles 5, 6. Refresh circuits 34 intersperse the required refresh cycles in a conventional manner by performing Read cycles 7 at the appropriate addresses in array 1.

Many modifications may be made within the spirit of the invention. For example, the Preset operation could be performed on all storage cells simultaneously, instead of column by column. That approach was not taken here because it would impose higher peak power requirements. The same is true of the Modify operation. The time penalties paid by the sequential performance of these operations is ordinarily of little consequence, since the read-only data will usually be loaded during a power-up or cold-start operation of a data processor or controller. The Preset cycles could also be achieved with a sequence of normal Write cycles, using binary Ones as the input data. In the structure of cells 12, the impurity region 1239 could be spread over the length of channel 1231 instead of being localized near drain 1233. This would require, however, that VT be increased from VT1 to VT2 for the word-select lines W. Other changes will also suggest themselves.

I claim as my invention:

1. A method of accessing fixed data contained in a combined read-only and read/write memory having an array of addressable storage cells each having an FET and a storage element, a first plurality of said FETs being physically constructed so as to have a first threshold voltage and a second plurality of said FETs being physically constructed so as to have a second threshold voltage different from said first threshold voltage, comprising the steps of:
    (a) first, accessing each of said cells with a voltage level capable of loading a first of two different data voltages into the storage element of each of said storage cells in said first plurality and a second of said data voltages into the storage element of each of said storage cells in said second plurality;
    (b) thereafter, selecting one of said storage cells so as to transfer the data voltage stored in its storage element to an output data line.

2. The method of claim 1, wherein step (a) comprises:
    (i) presetting a One voltage into the storage elements of all said addressable storage cells; and
    (ii) modifying said One voltage to a Zero voltage in those of said cells having a first of said two threshold voltages.

3. The method of claim 2, wherein step (a) (i) comprises:
    (A) holding a number of bit lines connected to said storage cells at a One voltage; and
    (B) sequentially selecting said storage cells.

4. The method of claim 2, wherein step (a) (ii) comprises:
    (A) reducing a select voltage to an intermediate value between said first and second threshold voltages.
    (B) holding a number of bit lines connected to said storage cells at a Zero voltage; and
    (C) sequentially selecting said storage cells with said intermediate-value select voltage so as to cause only those FETs having said first threshold voltage to be coupled to said bit lines.

5. The method of claim 1, wherein step (b) comprises:
    (i) holding a select voltage at a value higher than both of said threshold voltages; and
    (ii) coupling one of a number of bit lines to a data output; and
    (iii) selecting one of said storage cells with said select voltage so as to transfer the voltage of its storage element to said bit line and thence to said data output.

6. A combined read-only and read/write memory comprising:
    an array of storage cells each having a FET and a read/write storage element, said FETs in said array being of first and second physically different types having different threshold voltages whose geometrical arrangement defines a fixed data pattern; and control means adapted to load into the read/write storage elements of said array said fixed data pattern and to write into the read/write storage elements of said array variable external data.

7. A read/write storage device adapted to store additional read-only data, comprising:
an array having a plurality of storage cells of first and second types, storage cells of said first type comprising a storage element and an FET fabricated so as to have a first threshold voltage, storage cells of said second type comprising a storage element and an FET fabricated differently so as to have a second threshold voltage, said FETs of said first and second types being physically disposed in said array to represent said read-only data; and
control means operable in a first mode to convert said read-only data represented by the physical disposition of said two types of FETs into read/write data represented by first and second different voltages in said storage elements of said storage cells, said control means being operable in a second mode to read data represented by said data voltages from said storage elements independently of the physical disposition of said first and second types of FETs.

8. The memory of claim 7, wherein said storage element is a capacitor.

9. The memory of claim 8, wherein the FETs of said second type have a channel containing a localized region of higher doping for producing a substantially higher threshold voltage.

10. The memory of claim 9, wherein said localized region comprises implanted ions.

11. The memory of claim 7, wherein said control means includes a decoder comprising:
means for receiving a control signal;
generator means responsive to said control signal for producing first and second line voltages, said first line voltage being higher than both of said threshold voltages and said second line voltage being between said threshold voltages; and
switching means for coupling said line voltages to said array of storage cells.

12. The memory of claim 11, wherein said control means includes
sense means responsive to said control signal for coupling the cells of said array to a fixed potential when said generator means produces said second line voltage.

13. The memory of claim 11, wherein said control means includes
means for receiving a further control signal; and
means responsive to said further control signal for writing a predetermined data voltage into the cells of said array.

* * * * *